United States Patent
Shirahase et al.

(10) Patent No.: US 10,305,068 B2
(45) Date of Patent: May 28, 2019

(54) ORGANIC EL DISPLAY ELEMENT, ORGANIC EL DISPLAY PANEL, AND METHOD OF MANUFACTURING ORGANIC EL DISPLAY ELEMENT

(71) Applicant: JOLED INC., Tokyo (JP)

(72) Inventors: Hideyuki Shirahase, Tokyo (JP); Hiroyuki Ajiki, Tokyo (JP); Jun Hashimoto, Tokyo (JP); Masaki Nishimura, Tokyo (JP)

(73) Assignee: JOLED, INC., Tokyo (JP)

( * ) Notice: Subject to any disclaimer, the term of this patent is extended or adjusted under 35 U.S.C. 154(b) by 0 days.

(21) Appl. No.: 15/901,368

(22) Filed: Feb. 21, 2018

(65) Prior Publication Data
US 2018/0248154 A1    Aug. 30, 2018

(30) Foreign Application Priority Data
Feb. 24, 2017    (JP) .................. 2017-033617

(51) Int. Cl.
| H01L 51/52 | (2006.01) |
| H01L 27/32 | (2006.01) |
| H01L 51/50 | (2006.01) |
| H01L 51/56 | (2006.01) |

(52) U.S. Cl.
CPC ...... *H01L 51/5265* (2013.01); *H01L 27/3244* (2013.01); *H01L 51/5012* (2013.01); *H01L 51/5076* (2013.01); *H01L 51/5092* (2013.01); *H01L 51/5218* (2013.01); *H01L 51/5234* (2013.01); *H01L 51/56* (2013.01); *H01L 2227/323* (2013.01); *H01L 2251/308* (2013.01); *H01L 2251/5315* (2013.01); *H01L 2251/558* (2013.01)

(58) Field of Classification Search
None
See application file for complete search history.

(56) References Cited

U.S. PATENT DOCUMENTS

| 5,443,922 | A | 8/1995 | Nishizaki et al. |
| 8,680,542 | B2 | 3/2014 | Kurata et al. |
| 2012/0104423 | A1 | 5/2012 | Kurata et al. |
| 2014/0203271 | A1 | 7/2014 | Yoneda et al. |
| 2017/0222188 | A1* | 8/2017 | Lee .............. H01L 51/5281 |
| 2017/0373277 | A1* | 12/2017 | Noh ............. H01L 27/3244 |

FOREIGN PATENT DOCUMENTS

| JP | 05-163488 | 6/1993 |
| WO | 2012/020452 | 2/2012 |

* cited by examiner

*Primary Examiner* — Michelle Mandala
(74) *Attorney, Agent, or Firm* — Greenblum & Bernstein, P.L.C.

(57) ABSTRACT

An organic EL element includes an anode, a light emitting layer, a functional layer, a cathode, and a low refractive index layer. The light emitting layer is disposed above the anode. The functional layer is disposed on and in contact with the light emitting layer and includes a first metal. The cathode is disposed on and in contact with the functional layer and is made of a light transmissive metal oxide. The low refractive index layer is disposed on and in contact with the cathode. Refractive index of the low refractive index layer is smaller than refractive index of the cathode, film thickness of the functional layer is from 15 nm to 35 nm, and a distance between an anode-side surface of the light emitting layer and an interface between the cathode and the low refractive index layer is 110 nm or greater.

19 Claims, 8 Drawing Sheets

ORGANIC EL DISPLAY ELEMENT, ORGANIC EL DISPLAY PANEL, AND METHOD OF MANUFACTURING ORGANIC EL DISPLAY ELEMENT

This application claims priority to Japanese Patent Application No. 2017-33617 filed Feb. 24, 2017, the contents of which are hereby incorporated by reference in their entirety.

TECHNICAL FIELD

The present disclosure relates to organic electroluminescence (EL) display elements, organic EL display panels, and methods of manufacturing organic EL display elements, and in particular to organic EL elements that have an optical resonator structure.

BACKGROUND ART

Organic EL elements have characteristics such as a high visibility resulting from auto-luminescence and an excellent shock resistance resulting from a fully solid-state structure, and in recent years, display devices employing organic EL elements have become widespread.

An organic EL element has a structure in which at least a light emitting layer is disposed between a pair of electrodes (an anode and a cathode). Further, an organic EL element typically includes, between the light emitting layer and the cathode, a functional layer (an electron transport layer, an electron injection layer) for supplying electrons to the light emitting layer, a hole injection layer, a hole transport layer, and the like.

Improvements in light extraction efficiency from each color of light emitting element are sought for organic EL elements, with the view of decreasing power consumption and increasing life. In order to improve light extraction efficiency, techniques using optical resonator structures in each color of organic EL element, such as described in WO2012/020452, are publicly known.

SUMMARY

An organic EL element utilizing an optical resonator structure and having an optimal thickness of a light emitting layer and a functional layer will help to improve light extraction efficiency and to decrease power consumption.

The present disclosure includes an organic EL element that has high light extraction efficiency and low power consumption, and a method of manufacturing the organic EL element.

An organic EL element pertaining to at least one aspect of the present disclosure is an organic EL element including an anode, a light emitting layer, a functional layer, a cathode, and a low refractive index layer. The light emitting layer is disposed above the anode. The functional layer is disposed on and in contact with the light emitting layer and includes a first metal. The cathode is disposed on and in contact with the functional layer and is made of a light transmissive metal oxide. The low refractive index layer is disposed on and in contact with the cathode. Refractive index of the low refractive index layer is smaller than refractive index of the cathode, film thickness of the functional layer is from 15 nm to 35 nm, and a distance between an anode-side surface of the light emitting layer and an interface between the cathode and the low refractive index layer is 110 nm or greater.

According to at least one embodiment of the present disclosure, instead of a light emitting layer-side of the cathode, a low refractive index layer-side of the cathode becomes a reflective surface of an optical resonator. Thus, size of the optical resonator can be optimized by increasing film thickness of the cathode while maintaining optimization of film thickness of the light emitting layer and the functional layer. Accordingly, film thickness of the light emitting layer and the functional layer can be optimized, and power consumption can be reduced. Further, by increasing film thickness of the cathode without increasing film thickness of the functional layer beyond requirements, attenuation of light between the light emitting layer and the cathode may be suppressed, and the distance between the light emitting layer and the low refractive index layer can be made sufficiently long to extract light by utilizing first order optical interference. That is, first order optical interference can be used without excessively increasing film thickness for the light emitting layer and the functional layer, and therefore drive voltage can be decreased and light extraction efficiency can be increased.

BRIEF DESCRIPTION OF DRAWINGS

These and other objects, advantages, and features of one or more embodiments pertaining to the present disclosure will become apparent from the following description thereof taken in conjunction with the accompanying drawings, which illustrate at least one specific embodiment of the technology pertaining to the present disclosure.

FIG. 5A is a cross section illustrating a state in which a thin-film transistor (TFT) layer is formed on a substrate, FIG. 5B is a cross section illustrating a state in which an interlayer insulating layer is formed on the substrate, FIG. 5C is a cross section illustrating a state in which pixel electrode material is formed on the interlayer insulating layer, FIG. 5D is a cross section illustrating a state in which hole injection layer material is formed on the pixel electrode material, and FIG. 5E is a cross section illustrating a state in which pixel electrode layers and hole injection layers are formed.

FIG. 6A is a cross section illustrating a state in which a bank material layer is formed on the interlayer insulating layer and the pixel electrode layers and hole injection layers, FIG. 6B is a cross section illustrating a state in which bank layers are formed, FIG. 6C is a cross section illustrating a state in which hole transport layers are formed on the hole injection layers, and FIG. 6D is a cross section illustrating a state in which light emitting layers are formed on the hole transport layers.

FIG. 7A is a cross section illustrating a state in which an intermediate layer is formed on the light emitting layers and the bank layers, FIG. 7B is a cross section illustrating a state in which an electron injection/transport layer is formed on the intermediate layer, FIG. 7C is a cross section illustrating a state in which a counter electrode is formed on the electron injection/transport layer, and FIG. 7D is a cross section illustrating a state in which a low refractive index layer and sealing layer are formed on a light transmissive electrically conductive layer.

DETAILED DESCRIPTION

Figure 1:
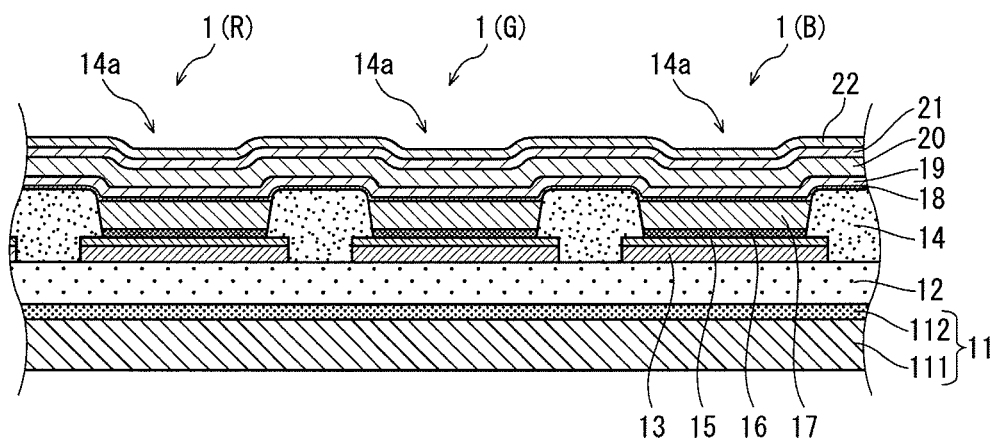
FIG. 1 is a cross-section schematically showing a structure of organic EL element 1 pertaining to at least one embodiment.

When attempting to improve light extraction efficiency by using zero order optical interference in an organic EL element utilizing an optical resonator structure, a distance between a light transmissive electrode and light emitting layer is typically designed to be about 20 nm. On the other hand, if film thickness of a functional layer is insufficient, injection of carriers (electrons or holes) is not sufficient, which causes an increase in power consumption of the organic EL element. Thus, the inventors investigated improving light extraction efficiency by using first order optical interference while ensuring sufficient film thickness of the functional layer.

However, when attempting to improve light extraction efficiency by utilizing first order optical interference, which is the next highest light extraction efficiency after zero order optical interference, a distance between a light emitting layer side of a light transmissive electrode and a light emitting center of a light emitting layer is about 110 nm or more. On the other hand, an increase in film thickness of the light emitting layer or functional layer beyond an appropriate range leads to an increase in drive voltage and decrease in light extraction efficiency for an organic EL element, which cause an increase in power consumption. For example, when film thickness of a light emitting layer is increased, resistance increases and power consumption increases. Further, in a case in which the light transmissive electrode is a cathode, an electron injection layer and electron transport layer are disposed between the light emitting layer and the light transmissive electrode, but the resulting film thickness increase leads to a decrease in light extraction efficiency. Typically, such functional layers are doped with metal in order to improve electron injectivity, and an alkali metal or alkaline earth metal is typically used due to having a small work function. On the other hand, alkali metals and alkaline earth metals have a property of absorbing visible light, and therefore if film thickness of a functional layer having electron injectivity is increased, light transmittance is decreased and light extraction efficiency is decreased.

Thus, the inventors investigated methods of utilizing an optical resonator structure while maintaining appropriate film thickness of a light emitting layer and functional layer, and arrived at the idea of providing a low refractive index layer in contact with a light transmissive electrode, wherein the light transmissive electrode is disposed between the low refractive index layer and the light emitting layer. Thus, an interface between the low refractive index layer and the light transmissive electrode becomes a reflective surface of the optical resonator instead of a light emitting layer side of the light transmissive electrode, and therefore the light transmissive electrode exists inside the optical resonator. Accordingly, an increase in film thickness of the light transmissive electrode allows optimization of optical resonator size without leading to a decrease in light extraction efficiency.

An organic EL element pertaining to at least one aspect of the present disclosure is an organic EL element including an anode, a light emitting layer, a functional layer, a cathode, and a low refractive index layer. The light emitting layer is disposed above the anode. The functional layer is disposed on and in contact with the light emitting layer and includes a first metal. The cathode is disposed on and in contact with the functional layer and is made of a light transmissive metal oxide. The low refractive index layer is disposed on and in contact with the cathode. Refractive index of the low refractive index layer is smaller than refractive index of the cathode, film thickness of the functional layer is from 15 nm to 35 nm, and a distance between an anode-side surface of the light emitting layer and an interface between the cathode and the low refractive index layer is 110 nm or greater.

An organic EL element pertaining to at least one aspect of the present disclosure is an organic EL element including an anode, a light emitting layer, a functional layer, an intermediate layer, a cathode, and a low refractive index layer. The light emitting layer is disposed above the anode. The functional layer is disposed above the light emitting layer and includes a first metal. The intermediate layer is disposed between and in contact with both the light emitting layer and the functional layer and includes a fluoride of a second metal that is an alkali metal or alkaline earth metal. The cathode is disposed on and in contact with the functional layer and is made of a light transmissive metal oxide. The low refractive index layer is disposed on and in contact with the cathode. Refractive index of the low refractive index layer is smaller than refractive index of the cathode, film thickness of the functional layer is from 15 nm to 35 nm, and a distance between an anode-side surface of the light emitting layer and an interface between the cathode and the low refractive index layer is 110 nm or greater.

According to at least one embodiment of the present disclosure, instead of a light emitting layer-side of the cathode, a low refractive index layer-side of the cathode becomes a reflective surface of an optical resonator. Thus, it is possible to optimize size of the optical resonator by increasing film thickness of the cathode while maintaining an optimum film thickness of the light emitting layer and the functional layer. Accordingly, film thickness of the light emitting layer and the functional layer can be optimized, and power consumption can be reduced. Further, by increasing film thickness of the cathode without increasing film thickness of the functional layer beyond requirements, attenuation of light between the light emitting layer and the cathode may be suppressed, and the distance between the light emitting layer and the low refractive index layer can be made sufficiently long to extract light by utilizing first order optical interference. That is, first order optical interference can be used without excessively increasing film thickness for the light emitting layer and the functional layer, and therefore drive voltage can be decreased and light extraction efficiency can be increased.

An organic EL display panel pertaining to at least one aspect of the present disclosure is an organic EL display panel in which the organic EL element pertaining to at least one aspect of the present disclosure is provided in plurality on a surface of a substrate.

The effects described above can also be obtained by the organic EL display panel pertaining to at least one aspect of the present disclosure.

A method pertaining to at least one aspect of the present disclosure is a method of manufacturing an organic EL element. The method includes forming an anode and a light emitting layer above the anode. The method further includes forming a functional layer including a metal material so as to be on and in contact with the light emitting layer. The method further includes forming a cathode made of a light transmissive metal oxide so as to be on and in contact with the functional layer. The method further includes forming a low refractive index layer that has a refractive index lower than that of the cathode so as to be on and in contact with the cathode. When forming the functional layer, film thickness of the functional layer is made to be from 15 nm to 35 nm, and when forming the cathode, a distance between an anode-side surface of the light emitting layer and an interface between the cathode and the low refractive index layer is made to be 110 nm or greater.

A method pertaining to at least one aspect of the present disclosure is a method of manufacturing an organic EL element. The method includes forming an anode and a light emitting layer above the anode. The method further includes forming an intermediate layer so as to be on and in contact with the light emitting layer. The method further includes forming a functional layer including a metal material so as to be on and in contact with the intermediate layer. The method further includes forming a cathode made of a light transmissive metal oxide so as to be on and in contact with the functional layer. The method further includes forming a low refractive index layer that has a refractive index lower than that of the cathode so as to be on and in contact with the cathode. When forming the intermediate layer, the intermediate layer is made to include a fluoride of a second metal that is an alkali metal or alkaline earth metal. Film thickness of the functional layer is made to be from 15 nm to 35 nm, and when forming the cathode, a distance between an anode-side surface of the light emitting layer and an interface between the cathode and the low refractive index layer is made to be 110 nm or greater.

The effects described above can also be obtained by an organic EL element formed by the method described above.

According to at least one embodiment, the cathode is made of indium tin oxide (ITO) or indium zinc oxide (IZO), and the refractive index of the low refractive index layer is 1.7 or less.

According to this configuration, light reflectance at the interface between the cathode and the low refractive index layer is improved, and the cathode functions as part of an optical path in the optical resonator structure.

According to at least one embodiment, the low refractive index layer is made of an insulative inorganic material.

According to at least one embodiment, material of the low refractive index layer is selected from one or more of SiO, SiON, NaF, $MgF_2$, and LiF.

According to this configuration, light reflectance at the interface between the cathode and the low refractive index layer is improved, and the cathode functions as part of an optical path in the optical resonator structure.

According to at least one embodiment, an optical resonator structure is formed in a region between a light emitting layer-side surface of the anode and an interface between the cathode and the low refractive index layer.

According to this configuration, first order optical interference of the optical resonator structure can be used, and light extraction efficiency can be further improved.

According to at least one embodiment, the functional layer is made of an organic material with an electron transport property, doped with the first metal.

According to this configuration, the functional layer has electron injectivity and a high electron transport property, and therefore the electron supply property from the functional layer to the light emitting layer improves, which contributes to a reduction in power consumption by reducing drive voltage.

According to at least one embodiment, the first metal material is selected from an alkali metal or alkaline earth metal.

According to at least one embodiment, concentration of the first metal in the functional layer is from 5 wt % to 40 wt %.

According to at least one embodiment, the first metal is barium or lithium.

According to this configuration, work function of the functional layer is small and electron injectivity is further improved, which contributes to a reduction in power consumption by reducing drive voltage.

According to at least one embodiment, the second metal is sodium.

According to this configuration, electron injectivity to the light emitting layer by the intermediate layer is further improved, which contributes to a reduction in power consumption by reducing drive voltage.

The following describes an organic EL element pertaining to at least one embodiment. The following description includes at least one embodiment to explain configuration, operation, and effects pertaining to at least one aspect of the present disclosure, and aside from essential elements of the present invention, the present invention is not limited to the following description. 1. Structure of organic EL element FIG. 1 is a partial cross section of an organic EL display panel 100 (see FIG. 9) pertaining to at least one embodiment. The organic EL display panel 100 includes pixels each including an organic EL element 1(R), an organic EL element 1(G), and an organic EL element 1(B), for emitting red, green, and blue light respectively. In FIG. 1, a cross section of one such pixel is shown.

In the organic EL display panel 100, each of the organic EL elements 1 is a top-emission type that emits light forwards (towards a top edge of FIG. 1).

The organic EL element 1(R), the organic EL element 1(G), and the organic EL element 1(B) have very similar configurations, and therefore are described as the organic EL element 1 where a distinction is not necessary.

In FIG. 1, the organic EL element 1 includes a substrate 11, an interlayer insulating layer 12, a pixel electrode 13, a bank layer 14, a hole injection layer 15, a hole transport layer 16, a light emitting layer 17, an intermediate layer 18, an electron injection/transport layer 19, a counter electrode 20, a low refractive index layer 21, and a sealing layer 22. The electron injection/transport layer 19 corresponds to the functional layer of the present disclosure. Further, the intermediate layer 18 corresponds to the intermediate layer of the present disclosure. The substrate 11, the interlayer insulating layer 12, the intermediate layer 18, the electron injection/transport layer 19, the counter electrode 20, the low refractive index layer 21, and the sealing layer 22 are not formed in a one-to-one ratio with the pixels, but to be common to a plurality of the organic EL elements 1 included in the organic EL display panel 100.

<Substrate>

The substrate 11 includes a base material 111 that is an insulating material and a thin film transistor (TFT) layer 112. The TFT layer 112 includes a drive circuit for each pixel. The base material 111 may be a glass substrate, a silica glass substrate, a silicon substrate, a metal substrate such as molybdenum sulfide, copper, zinc, aluminium, stainless steel, magnesium, iron, nickel, gold, silver, or the like, or a semiconductor substrate such as gallium arsenide, a plastic substrate, or the like. As a plastic substrate, a thermoplastic resin or thermosetting resin may be used. For example, it is possible to use polyethylene, polypropylene, polyamide, polyimide (PI), polycarbonate, acrylic resin, polyethylene terephthalate (PET), polybutylene terephthalate, polyacetal, a fluorine resin, a thermoplastic elastomer such as styrene, polyolefin, polyvinyl chloride, polyurethane, fluorine rubber, chlorinated polyethylene, an epoxy resin, unsaturated polyester, silicone resin, polyurethane, or the like, copolymers containing these, a copolymer blend, a polymer alloy, or the like, or a laminate in which one or more of the above are laminated.

<Interlayer Insulating Layer>

The interlayer insulating layer 12 is formed on the substrate 11. The interlayer insulating layer 12 is provided in order to planarize unevenness of an upper surface of the TFT layer 112. The interlayer insulating layer 12 includes a resin material such as a positive photosensitive material. As such a photosensitive resin material, acrylic resin, polyimide resin, siloxane resin, or phenol resin can be used. Further, although not shown in the cross section of FIG. 1, the interlayer insulating layer 12 has a contact hole formed therein for each of the pixels.

<Pixel Electrode>

The pixel electrode 13 includes a metal layer made of a light reflective metal material, and is formed on the interlayer insulating layer 12. The pixel electrode 13 is provided for each pixel, and each of the pixel electrodes 13 is electrically connected to the TFT layer 112 via a contact hole.

According to at least one embodiment, the pixel electrode 13 functions as an anode.

As specific examples of such a light reflective metal material, silver (Ag), aluminum (Al), aluminum alloy, molybdenum (Mo), an alloy of silver, palladium, and copper (APC), an alloy of silver, rubidium, and gold (ARA), an alloy of molybdenum and chromium (MoCr), an alloy of molybdenum and tungsten (MoW), an alloy of nickel and chromium (NiCr), or the like may be used.

The pixel electrode 13 may be a single metal layer, or may be a laminated structure in which a layer made of a metal oxide such as indium tin oxide (ITO) or indium zinc oxide (IZO) is layered on a metal layer.

<Bank Layer>

The bank layer 14 is formed so as to leave exposed a partial region of a top surface of the pixel electrode 13 and the hole injection layer 15, while covering a peripheral region of the hole injection layer 15 surrounding the partial region. The partial region of the top surface of the hole injection layer 15 that is not covered by the bank layer 14 (hereinafter referred to as an "opening") corresponds to a subpixel. In other words, the bank layer 14 has an opening 14a for each subpixel.

According to at least one embodiment, where the pixel electrode 13 is not present, the bank layer 14 is formed on the interlayer insulating layer 12. In other words, where the pixel electrode 13 is not present, a bottom surface of the bank layer 14 is in contact with a top surface of the interlayer insulating layer 12.

The bank layer 14 includes, for example, of an insulating organic material. Examples of an insulating organic material include acrylic resin, polyimide resin, novolac resin, and phenol resin. In the case where the light emitting layer 17 is formed using an application method, the bank layer 14 functions as a structure for preventing overflow of an applied ink. In the case where the light emitting layer 17 is formed using a vapor deposition method, the bank layer 14 functions as a structure for placing a vapor deposition mask. According to at least one embodiment, the bank layer 14 includes a resin material, and the material of the bank layer 14 may be an acrylic resin, polyimide resin, siloxane resin, or phenol resin. According to at least one embodiment, phenol resin is used.

<Hole Injection Layer>

The hole injection layer 15 is disposed on the pixel electrode 13 in order to promote injection of holes from the pixel electrode 13 to the light emitting layer 17. The hole injection layer 15 may be a layer including an oxide of silver (Ag), molybdenum (Mo), chromium (Cr), vanadium (V), tungsten (W), nickel (Ni), iridium (Ir), or the like, or an electrically conductive polymer such as poly(3,4-ethylenedioxythiophene) polystyrene sulfonate (PEDOT:PSS). The hole injection layer 15 including such a metal oxide has a function of assisting generation of holes and stably injecting the holes to the light emitting layer 17, and has a high work function. According to at least one embodiment, the hole injection layer 15 includes tungsten oxide. In the hole injection layer 15 including a transition metal oxide, a plurality of oxidation numbers can be obtained, achieving facilitation of hole injection and a contributing to a reduction in drive voltage.

<Hole Transport Layer>

The hole transport layer 16 is formed in the opening 14a by using a polymer compound having no hydrophilic group. For example, a polymer compound having no hydrophilic group, such as polyfluorene, a derivative thereof, polyarylamine, a derivative thereof, or the like can be used.

The hole transport layer 16 has a function of transporting holes that are injected by the hole injection layer 15 to the light emitting layer 17.

<Light Emitting Layer>

The light emitting layer 17 is formed in the opening 14a. The light emitting layer 17 has a function of emitting light of one of red (R), green (G), and blue (B) colors, according to recombination of holes and electrons. The light emitting layer 17 includes a known material.

For example, as described in JP H5-163488, the light emitting layer 17 includes a fluorescent substance such as an oxinoid compound, perylene compound, coumarin compound, azacoumarin compound, oxazole compound, oxadiazole compound, perinone compound, pyrrolopyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of 8-hydroxyquinoline compound, metal complex of 2-bipyridine compound, complex of a Schiff base and group III metal, oxine metal complex, or rare earth complex.

<Intermediate Layer>

The intermediate layer 18 is formed on the light emitting layer 17 and includes a fluoride of a metal material having an electron injection property. The metal material is selected from alkali metals or alkaline earth metals. The alkali metals are lithium (Li), sodium (Na), potassium (K), rubidium (Rb), cesium (Cs), and francium (Fr). Examples of alkaline earth metals are calcium (Ca), strontium (Sr), barium (Ba), and radium (Ra). According to at least one embodiment, Na is selected.

<Electron Injection/Transport Layer>

The electron injection/transport layer 19 is formed on the intermediate layer 18, and includes an organic material that has an electron transport property and is doped with a metal material to improve electron injectivity. Here, doping refers to substantially evenly dispersing metal atoms or metal ions of a metal material in an organic material, forming a single phase containing the organic material and a trace amount of the metal material. According to at least one embodiment, other phases, in particular a phase composed only of the metal material, such as a metal piece or metal film, or a phase containing the metal material as a main component, are not present. Further, according to at least one embodiment, in a single phase containing an organic material and a trace amount of a metal material, concentration of the metal atom or metal ion is uniform and the metal atoms or metal ions are not aggregated. According to at least one embodiment, the metal material is selected from alkali metals, alkaline earth metals, or ytterbium (Yb). According to at least one embodiment, the metal material is Ba or Li. According to at least one embodiment, Ba is selected. Further, according to at least one embodiment, in the electron injection/transport layer 19, the doping amount of metal material is from 5 wt % to 40 wt %. According to at least one embodiment, the doping amount of metal material is 20 wt % in the electron injection/transport layer 19.

As the organic material that has an electron transport property, for example, a π-electron low molecular weight organic material such as an oxadiazole derivative (OXD), triazole derivative (TAZ), or phenanthroline derivative (BCP, Bphen) can be used.

<Counter Electrode>

The counter electrode 20 includes a light transmissive electrically conductive metal oxide, and is formed on the electron injection/transport layer 19. The counter electrode 20 functions as a cathode.

According to at least one embodiment, in the counter electrode 20, transmittance of light emitted from the light emitting layer 17 is higher than transmittance of the electron injection/transport layer 19. The counter electrode 20 may include ITO or IZO, for example. According to at least one embodiment, ITO is used.

The interface between the low refractive index layer 21 and the counter electrode 20 forms an optical resonator structure. Accordingly, in at least one embodiment, refractive index of the counter electrode 20 is close to refractive index of the electron injection/transport layer 19 and different from refractive index of the low refractive index layer 21.

<Low Refractive Index Layer>

The low refractive index layer 21 includes a light transmissive material, formed on the counter electrode 20.

The interface between the low refractive index layer 21 and the counter electrode 20 forms an optical resonator structure when paired with the interface between the pixel electrode 13 and the hole injection layer 15. Accordingly, when light emitted from the light emitting layer 17 is incident on the low refractive index layer 21 from the counter electrode 20, a portion thereof is reflected to the counter electrode 20. Accordingly, in at least one embodiment, the low refractive index layer 21 and the counter electrode 20 have different refractive indices from each other. More specifically, the refractive index of ITO is approximately 2.0, and therefore the refractive index of the low refractive index layer 21 is 1.7 or less according to at least one embodiment.

Further, the interface between the low refractive index layer 21 and the counter electrode 20 is a reflective surface of the optical resonator structure, and therefore the interface between the counter electrode 20 and the electron injection/transport layer 19 has lower reflectivity than the interface between the low refractive index layer 21 and the counter electrode 20 according to at least one embodiment. Accordingly, the refractive index of the low refractive index layer 21 is lower than the refractive index of the electron injection/transport layer 19 according to at least one embodiment.

Examples of material of the low refractive index layer 21 include silicon oxide ($SiO_x$), silicon oxynitride (SiON), sodium fluoride (NaF), magnesium fluoride ($MgF_2$), lithium fluoride (LiF), and the like.

The low refractive index layer 21 is not an element of an electric circuit of the organic EL element 1, and therefore need not have electrical conductivity and may be an insulator. However, the low refractive index layer 21 may be a semiconductor or made of an electrically conductive material. In such a case, a laminate structure composed of the low refractive index layer 21 and the counter electrode 20 functions as the cathode.

<Sealing Layer>

The sealing layer 22 has a function of suppressing exposure to air and water of functional layers such as the light emitting layer 17, the intermediate layer 18, and the electron injection/transport layer 19, and includes a light transmissive material such as silicon nitride (SiN), silicon oxynitride (SiON), or the like. Further, a sealing resin layer including a resin material such as acrylic resin, silicone resin, or the like may be provided on a layer including a material such as silicon nitride (SiN), silicon oxynitride, or the like.

According to at least one embodiment, the organic EL display panel 100 is a top-emission type, and therefore the sealing layer 22 includes a light transmissive material.

Although not illustrated in FIG. 1, a color filter and upper substrate may be joined to the sealing layer 22 via a sealing resin. By joining the upper substrate, the hole transport layer 16, the light emitting layer 17, the intermediate layer 18, and the electron injection/transport layer 19 can be protected from moisture, air, and the like.

2. Optical Resonator Structure

Figure 2:
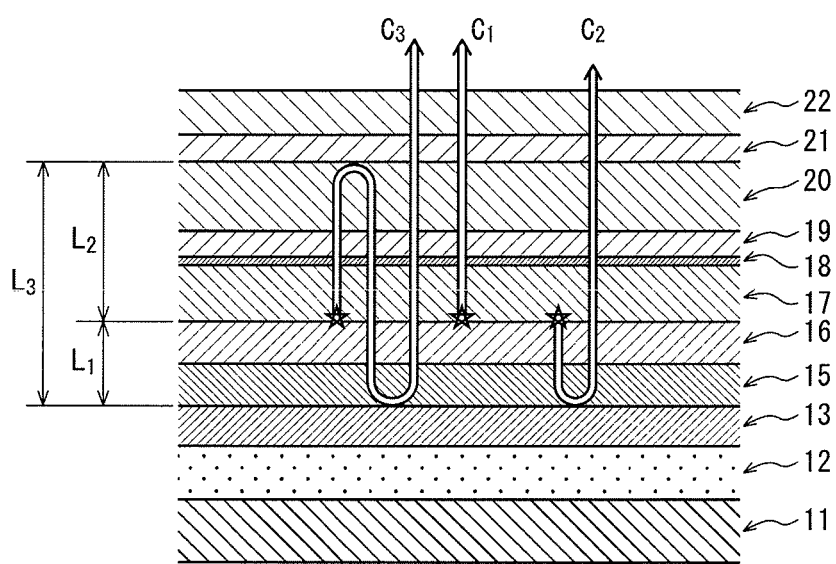
FIG. 2 is a diagram of optical interference in an optical resonator structure formed in an organic EL element pertaining to at least one embodiment.

FIG. 2 is a diagram for describing optical interference in the optical resonator structure of the organic EL element 1 pertaining to at least one embodiment. The optical resonator structure is formed between the interface between the pixel electrode 13 and the hole injection layer 15 and the interface between the low refractive index layer 21 and the counter electrode 20. That is, the counter electrode 20 and the light emitting layer 17 exist within the optical resonator structure.

FIG. 2 is a diagram illustrating primary paths of light emitted from the light emitting layer 17 according to at least one embodiment. Path C1 is a path of light emitted from the light emitting layer 17 towards the low refractive index layer 21 that is transmitted through the low refractive index layer 21 without being reflected. Path C2 is a path of light emitted from the light emitting layer 17 towards the pixel electrode 13 that is reflected at the pixel electrode 13 and transmitted through the light emitting layer 17 and the low refractive index layer 21. Path C3 is a path of light emitted from the light emitting layer 17 towards the low refractive index layer 21 that is reflected at the low refractive index layer 21, further reflected at the pixel electrode 13, and then transmitted through the light emitting layer 17 and the low refractive index layer 21. Optical interference occurs between light emitted from each of the paths C1 to C3.

A difference in optical distance between path C1 and path C2 corresponds to an optical film thickness L1 indicated in FIG. 2. The optical film thickness L1 is the total optical distance (product of film thickness and refractive index of each layer) of the hole transport layer 16 and the hole injection layer 15 from the light emitting layer 17 to the interface between the pixel electrode 13 and the hole injection layer 15.

A difference in optical distance between path C2 and path C3 corresponds to an optical film thickness L2 indicated in FIG. 2. The optical film thickness L2 is the optical distance (product of film thickness and refractive index of each layer) of the intermediate layer 18, the electron injection/transport layer 19, and the counter electrode 20 from the light emitting layer 17 to the interface between the low refractive index layer 21 and the counter electrode 20.

Further, a difference in optical distance between path C1 and path C3 corresponds to an optical film thickness L3 indicated in FIG. 2. The optical film thickness L3 is the sum of the optical film thickness L1 and the optical film thickness L2.

Figure 3:
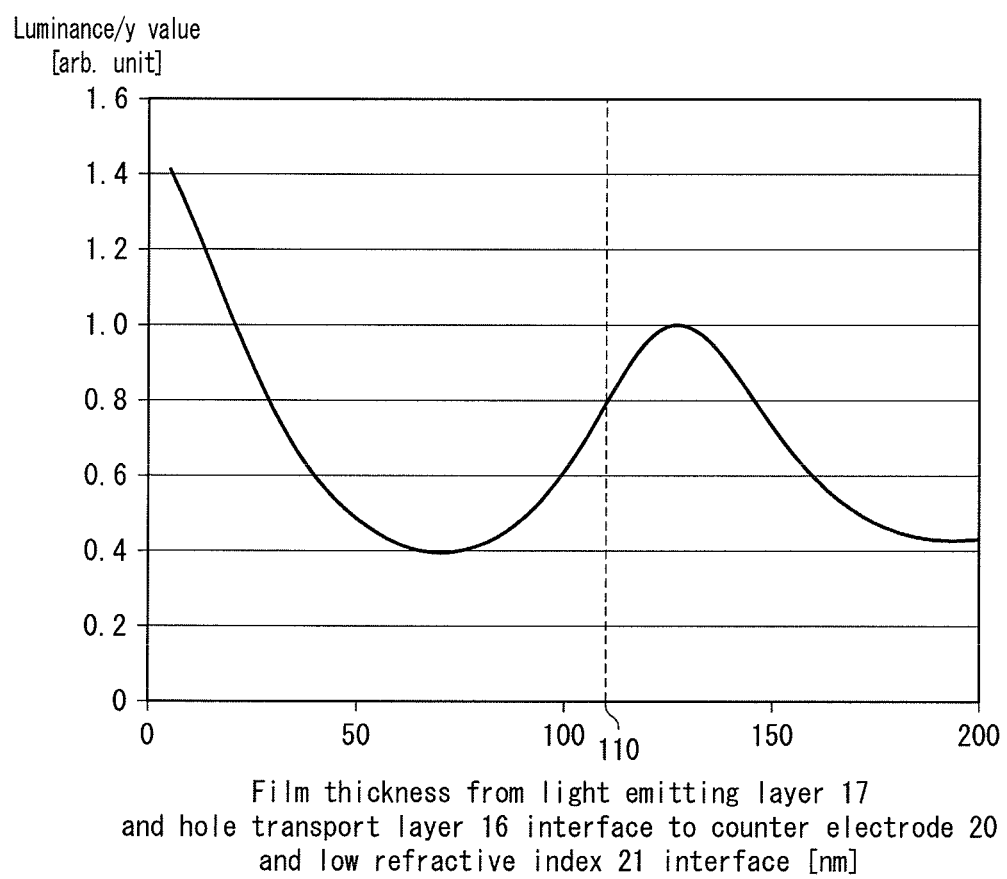
FIG. 3 is a graph showing a relationship between a value of luminance/y of light extracted from an organic EL element and film thickness from an anode-side surface of a light emitting layer to an interface between a counter electrode and a low refractive index layer pertaining to at least one embodiment.

In the optical resonator structure, the optical film thicknesses L1, L2, and L3 are set so that light emitted from the paths C1, C2, and C3 is intensified. For each of the optical film thicknesses L1, L2, and L3, an optical film thickness at which light extraction efficiency is equal to or greater than a threshold value exists for not only the zero order optical interference peak but also the first order optical interference peak. FIG. 3 indicates optical film thickness between the light emitting layer 17 and the hole transport layer 16 interface and the counter electrode 20 and the low refractive index layer 21 interface and the luminance/y value of light to be extracted. In the graph of FIG. 3, the optical film thickness between the light emitting layer 17 and the hole transport layer 16 interface and the counter electrode 20 and the low refractive index layer 21 interface is the horizontal axis, and corresponds to the optical film thickness L2 in FIG. 2. The luminance/y value is the vertical axis of the graph of FIG. 3, is a ratio of luminance of light extracted from the organic EL element and the y value of xy chromaticity, and indicates a relative value with 1 being the maximum value of the first order optical interference peak. According to at least one embodiment, the optical film thickness L2 is set to the distance of the first order optical interference peak, or close to this value. This is because, for an optical film thickness at which light extraction efficiency is maximized, chromaticity of extracted light may not necessarily be a desired chromaticity, and as a result of correction by the color filter, light extraction efficiency may decrease after transmission through the color filter. Thus, according to at least one embodiment, distance between the counter electrode 20 and low refractive index layer 21 interface and the pixel electrode 13 side of the light emitting layer 17 is approximately 110 nm or greater.

3. Electron Injection/Transport Layer Film Thickness

Figure 4A:
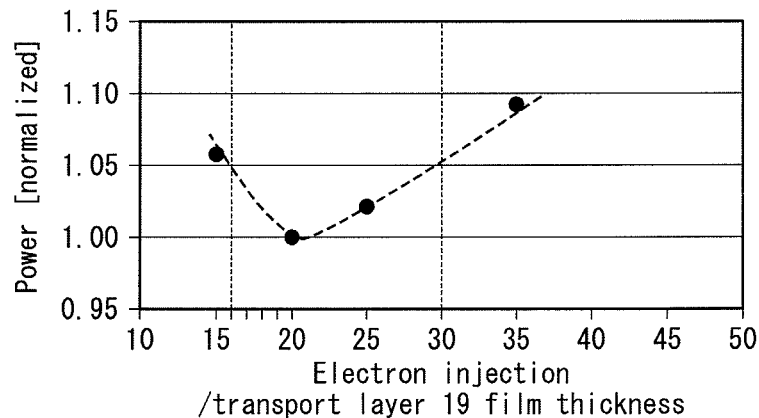
FIG. 4A, FIG. 4B, and FIG. 4C are graphs showing a relationship pertaining to at least one embodiment between film thickness of electron injection/transport layer 19 and power consumption of organic EL element 1, for a red organic EL element, a green organic EL element, and a blue organic EL element, respectively.
Figure 4B:
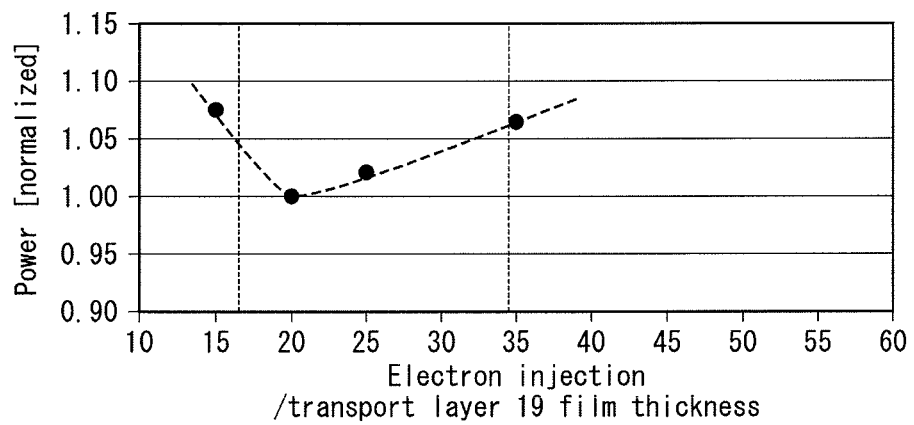
Figure 4C:
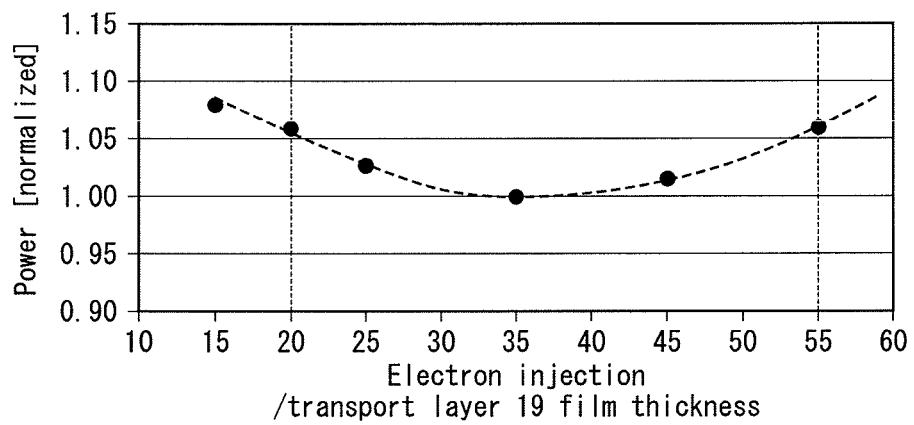

FIG. 4A, FIG. 4B, and FIG. 4C are graphs indicating a relationship between film thickness of the electron injection/transport layer 19 and power consumption of the organic EL element 1 according to at least one embodiment. According to at least one embodiment, the metal with which the electron injection/transport layer 19 is doped is barium (Ba), and the doping concentration is 20 wt %. FIG. 4A is a diagram indicating the relationship for the organic EL element 1(R), FIG. 4B is a diagram indicating the relationship for the organic EL element 1(G), and FIG. 4C is a diagram indicating the relationship for the organic EL element 1(B).

In FIG. 4A, FIG. 4B, and FIG. 4C, when film thickness of the electron injection/transport layer 19 is approximately 35 nm or greater, the greater the film thickness of the electron injection/transport layer 19, the greater the power consumption. Increasing the film thickness of the electron injection/transport layer 19 increases light absorption by the barium dopant, resulting in a decrease in light extraction efficiency.

On the other hand, in FIG. 4A, FIG. 4B, and FIG. 4C, when film thickness of the electron injection/transport layer 19 is approximately 15 nm or less, the smaller the film thickness of the electron injection/transport layer 19, the greater the power consumption. This is because the smaller the film thickness of the electron injection/transport layer 19, the smaller the amount of barium, decreasing electron injectivity which increases drive voltage of the organic EL element 1.

Accordingly, film thickness of the electron injection/transport layer 19 achieves a suitable light emission efficiency in a range from 15 nm to 35 nm for the organic EL element 1(R), in a range from 15 nm to 40 nm for the organic EL element 1(G), and in a range from 10 nm to 60 nm for the organic EL element 1(B).

As stated above, the electron injection/transport layer 19 is not formed for each pixel, but is common to a plurality of the organic EL elements 1 of the organic EL display panel 100. Accordingly, the film thickness of the electron injection/transport layer 19, which is common to the plurality of the organic EL elements 1, is in the range from 15 nm to 35 nm according to at least one embodiment.

4. Film Thickness of Intermediate Layer and Light Transmissive Electrically Conductive Layer According to at least one embodiment, film thickness of the intermediate layer 18 achieves improvement of electron injectivity and reduction of drive voltage of the organic EL element 1, and is from 1 nm to 10 nm. Film thickness of the intermediate layer 18 in the range from 1 nm to 10 nm makes it possible to maintain electron injectivity to the light emitting layer 17 while suppressing an increase in drive voltage.

Film thickness of the counter electrode 20 is designed so that the optical distance of the intermediate layer 18, the electron injection/transport layer 19, and the counter electrode 20 corresponds to the designed value of the optical film thickness L2. That is, when the film thickness of the intermediate layer 18 is $t_1$, and the refractive index $n_1$, film thickness of the electron injection/transport layer 19 is $t_2$, and the refractive index $n_2$, film thickness of the counter electrode 20 is $t_3$, and the refractive index $n_3$, the film thickness $t_3$ of the counter electrode 20 is determined such that $n_1 t_1 + n_2 t_2 + n_3 t_3$ is equal to the designed value of the optical film thickness L2. Accordingly, film thickness of the counter electrode 20 is designed according to the remaining optical distance necessary to realize the designed value of the optical film thickness L2.

5. Method of Manufacturing Organic EL Element

A method of manufacturing the organic EL element 1 is described with reference to the drawings. FIG. 5A to FIG. 5E, FIG. 6A to FIG. 6D, and FIG. 7A to FIG. 7D are schematic cross sections showing states of processes in manufacture of the organic EL element 1 according to at least one embodiment.

(1) Forming Substrate 11

Figure 5A:
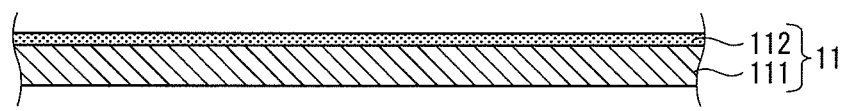
FIG. 5A, FIG. 5B, FIG. 5C, FIG. 5D, and FIG. 5E are partial cross sections schematically illustrating a portion of manufacturing an organic EL element pertaining to at least one embodiment.
Figure 8:
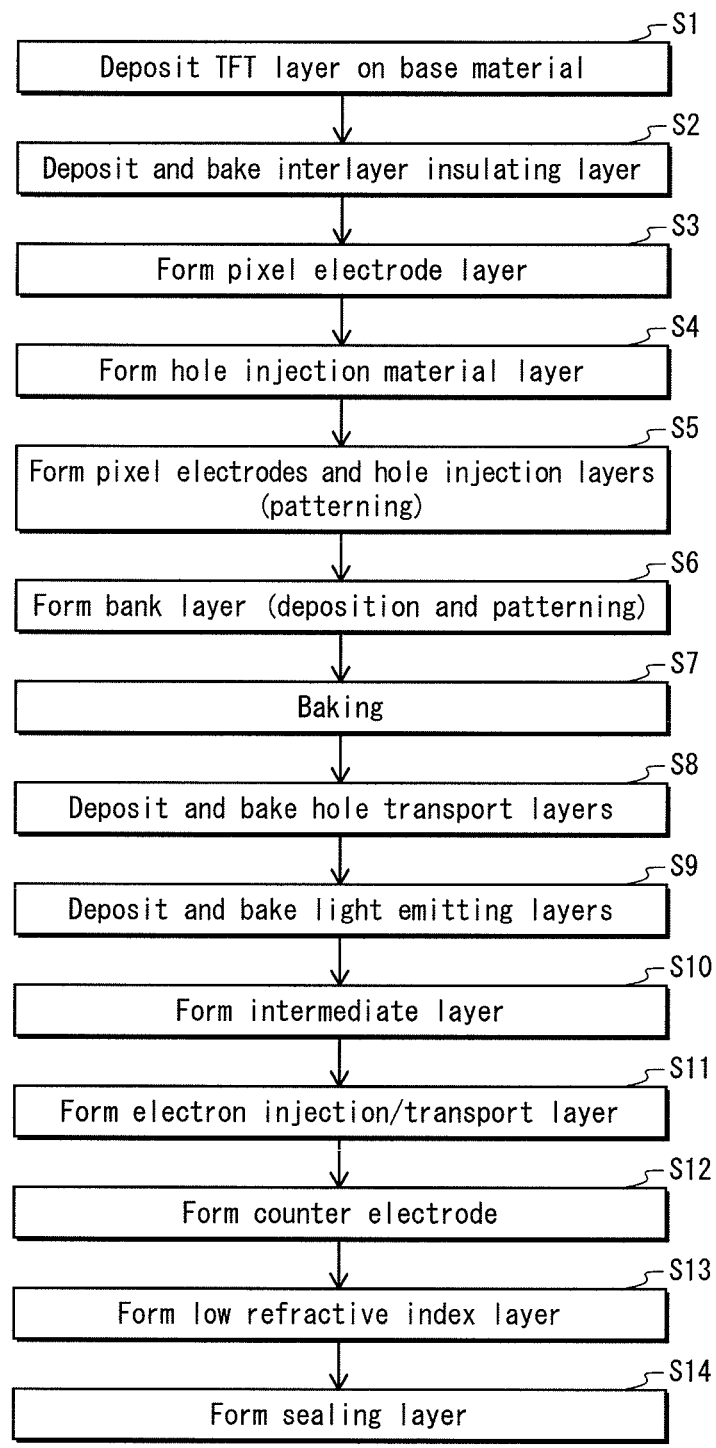
FIG. 8 is a flowchart illustrating manufacturing of an organic EL element pertaining to at least one embodiment.

First, in FIG. 5A, the TFT layer 112 is formed on the base material 111 to form the substrate 11 (step S1 in FIG. 8). The TFT layer 112 can be formed by a publicly-known method of TFT manufacture.

Figure 5B:
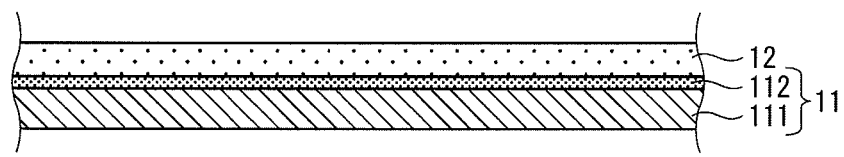

Next, in FIG. 5B, the interlayer insulating layer 12 is formed on the substrate 11 (step S2 in FIG. 8). The interlayer insulating layer 12 can be formed by using plasma chemical vapor deposition (CVD), sputtering, or the like.

Next, in the interlayer insulating layer 12, contact holes are formed by dry etching at locations on source electrodes of the TFT layer. The contact holes are formed so that the bottom of each contact hole exposes a surface of a source electrode.

Next, contact electrode layers are formed following inner walls of the contact holes. Portions of upper portions of the contact electrode layers are disposed on the interlayer insulating layer 12. Forming of the contact electrode layers can be achieved, for example, by using sputtering, then after a metal film is deposited, performing patterning by using photolithography and wet etching.

(2) Forming Pixel Electrode 13 and Hole Injection Layer 15

Figure 5C:
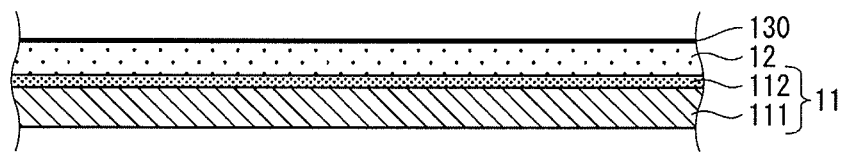

Next, in FIG. 5C, a pixel electrode material layer 130 is formed on the interlayer insulating layer 12 (step S3 in FIG. 8). The pixel electrode material layer 130 can be formed by using vacuum deposition, sputtering, or the like.

Figure 5D:
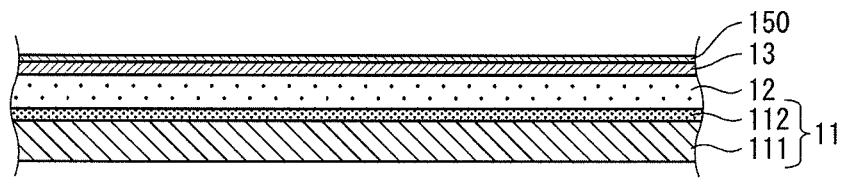

Next, in FIG. 5D, a hole injection material layer 150 is formed on the pixel electrode material layer 130 (step S4 in FIG. 8). The hole injection material layer 150 can be formed by using vacuum deposition, sputtering, or the like.

Figure 5E:
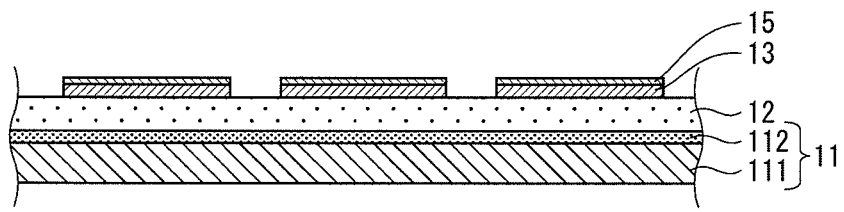

Next, in FIG. 5E, the pixel electrode material layer 130 and the hole injection material layer 150 are patterned by etching, to form the pixel electrode 13 and the hole injection layer 15 in plurality, one of each for each sub pixel (step S5 in FIG. 8).

Methods for forming the pixel electrode 13 and the hole injection layer 15 are not limited to the methods above, and, for example, the hole injection layer 15 may be formed after forming the pixel electrode 13 by patterning the pixel electrode material layer 130.

(3) Forming Bank Layer 14

Figure 6A:
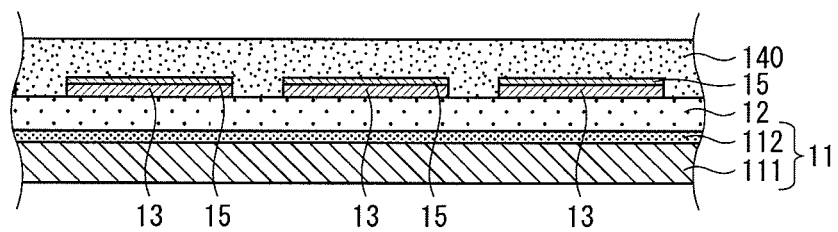
FIG. 6A, FIG. 6B, FIG. 6C, and FIG. 6D are partial cross sections schematically illustrating a portion of manufacturing an organic EL element pertaining to at least one embodiment.
Figure 6B:
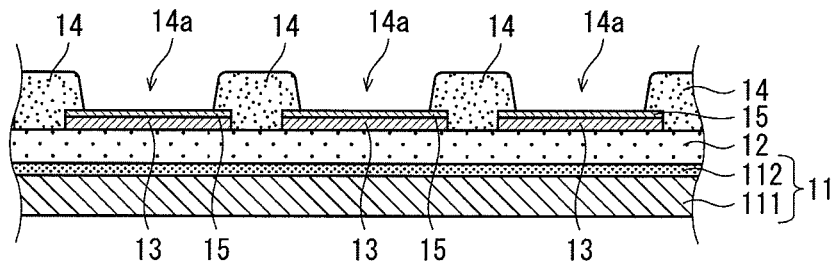

Next, in FIG. 6A, bank layer resin, which is a material of the bank layer 14, is applied on the hole injection layer 15 and the interlayer insulating layer 12, forming a bank material layer 140. The bank material layer 140 is formed by using a spin coat method or the like to uniformly apply a solution in which phenol resin, which is the bank layer resin, is dissolved in solvent (such as mixed solvent of ethyl lactate and γ-butyrolactone (GBL)), onto the hole injection layer 15 and the interlayer insulating layer 12. Next, the bank layer 14 is formed by performing pattern exposure and developing on the bank material layer 140 (FIG. 6B and step S6 in FIG. 8), then baking the bank layer 14 (step S7 in FIG. 8). The bank layer 14 defines the opening 14a, which is a region in which the light emitting layer 17 is to be formed. Baking of the bank layer 14 is performed at a temperature from 150° C. to 210° C. for 60 minutes, according to at least one embodiment.

In a process of forming the bank layer 14, a surface of the bank layer 14 may undergo surface processing with use of a predetermined alkaline solution, water, organic solvent, or the like, and may undergo plasma processing. Surface processing of the bank layer 14 is performed in order to adjust a contact angle of the bank layer 14 relative to ink (solution) to be applied to the opening 14a, or to provide the surface of the bank layer 14 with water repellency.

(4) Forming Hole Transport Layer 16

Figure 6C:
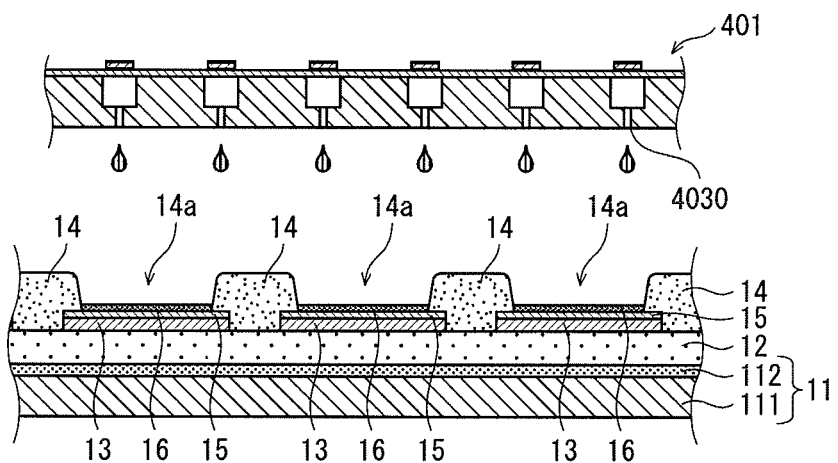

Next, in FIG. 6C, ink containing material of the hole transport layer 16 is ejected from a nozzle 4030 of an inkjet head 401 to be applied onto the hole injection layer 15 in the opening 14a, which is defined by the bank layer 14, then baking (drying) is performed to form the hole transport layer 16 (step S8 in FIG. 8).

(5) Forming Light Emitting Layer 17

Figure 6D:
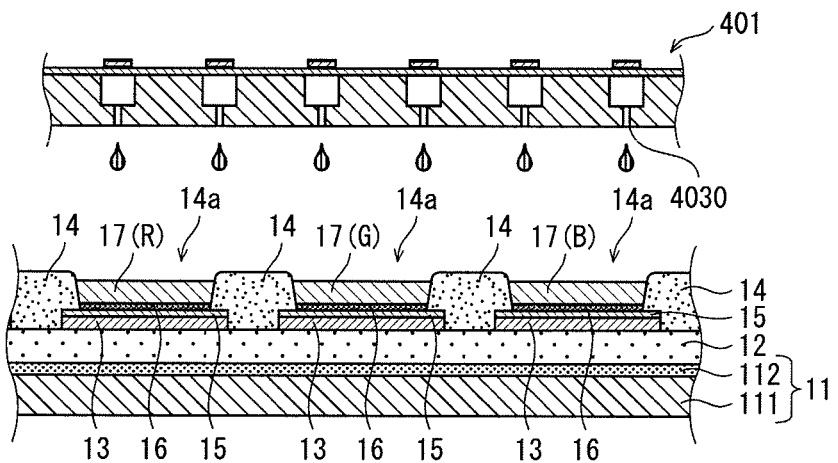

Next, in FIG. 6D, ink containing material of the light emitting layer 17 is ejected from the nozzle 4030 of the inkjet head 401 to be applied onto the hole transport layer 16 in the opening 14a, then baking (drying) is performed to form the light emitting layer 17 (step S9 in FIG. 8).

(6) Forming Intermediate Layer 18

Figure 7A:
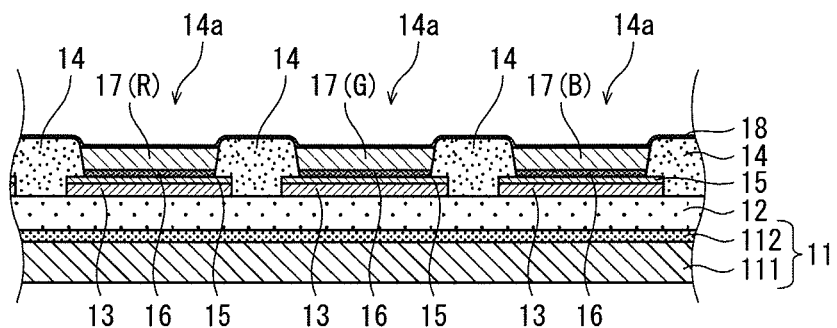
FIG. 7A, FIG. 7B, FIG. 7C, and FIG. 7D are partial cross sections schematically illustrating a portion of manufacturing an organic EL element pertaining to at least one embodiment.

Next, in FIG. 7A, the intermediate layer 18 is formed on the light emitting layer 17 and the bank layer 14 (step S10 in FIG. 8). The intermediate layer 18 is deposited to be a continuous film across each sub pixel, for example by vacuum deposition of NaF, which is a fluoride of an alkali metal.

(7) Forming Electron Injection/Transport Layer 19

Figure 7B:
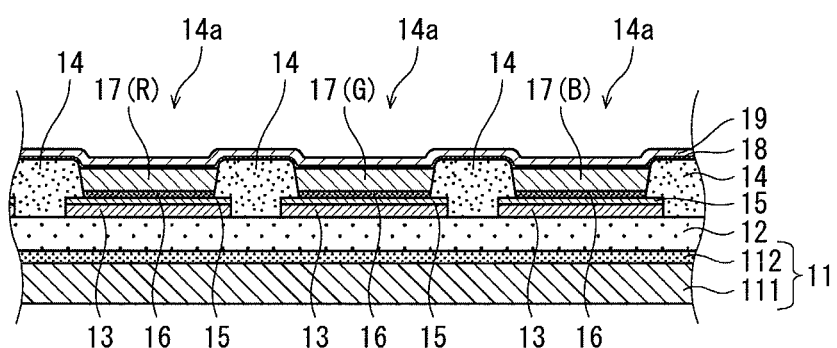

Next, in FIG. 7B, the electron injection/transport layer 19 is formed on the intermediate layer 18 (step S11 in FIG. 8). The electron injection/transport layer 19 is deposited to be a continuous film across each sub pixel, for example by co-evaporation and deposition of an organic material having an electron transport property and a metal dopant.

(8) Forming Counter Electrode 20

Figure 7C:
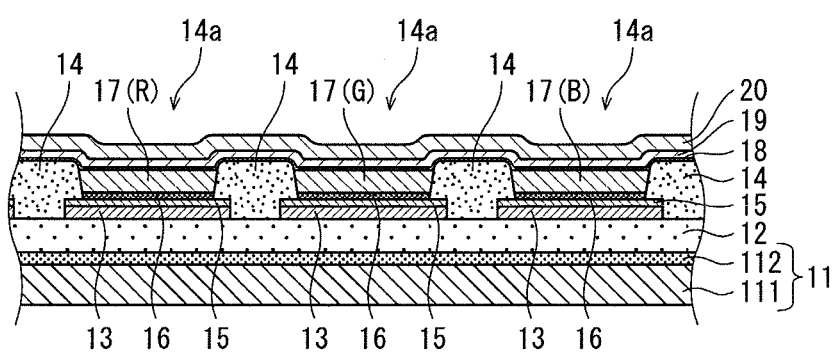

Next, in FIG. 7C, the counter electrode 20 is formed on the electron injection/transport layer 19 (step S12 in FIG. 8). The counter electrode 20 is formed by sputtering or vacuum deposition of ITO or IZO.

(9) Forming Low Refractive Index Layer 21

Figure 7D:
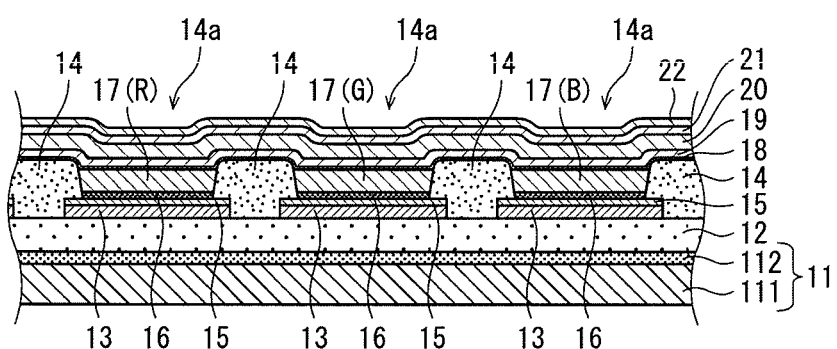

Next, in FIG. 7D, the low refractive index layer 21 is formed on the counter electrode 20 (step S13 in FIG. 8). The low refractive index layer 21 is formed by sputtering, vacuum deposition, CVD, or the like of an inorganic material. For example, CVD of SiO to form a film that is common to each sub pixel.

(10) Forming Sealing Layer 22

Next, in FIG. 7D, the sealing layer 22 is formed on the low refractive index layer 21 (step S14 in FIG. 8). The sealing layer 22 can be formed by sputtering, CVD, or the like.

A color filter and an upper substrate may be joined onto the sealing layer 22.

6. Overall structure of organic EL display device

Figure 9:
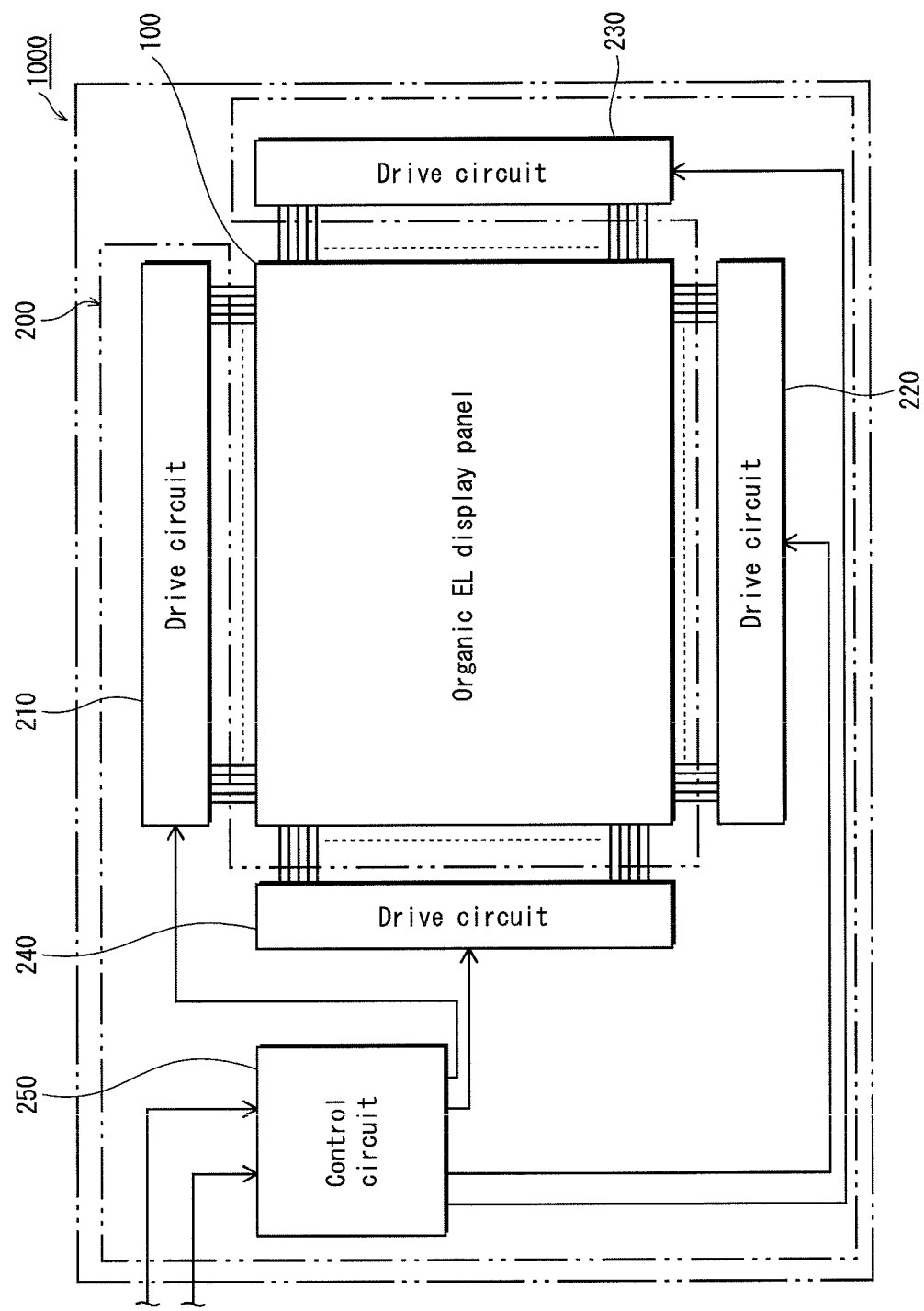
FIG. 9 is a block diagram showing a structure of an organic EL display device incorporating an organic EL element pertaining to at least one embodiment.

FIG. 9 is a schematic block diagram of a configuration of an organic EL display device 1000 that includes the organic EL display panel 100. In FIG. 9, the organic EL display device 1000 includes the organic EL display panel 100 and a drive/control unit 200 connected thereto. The drive control unit 200 includes four drive circuits 210 to 240 and a control circuit 250.

In one or more embodiments of the organic EL display device 1000, the drive control unit 200 is not limited to this arrangement relative to the organic EL display panel 100.

In the description of at least one embodiment above, a case in which a light emitting panel pertaining to the present disclosure is applied to the organic EL display device is described, but the present disclosure is not limited to this example. A light emitting panel pertaining to the present disclosure may be a light emitting panel using an inorganic light emitting material.

Further, in at least one embodiment described above, the cathode is the counter electrode and the embodiment is of a top-emission type of organic EL display device. However, for example, at least one embodiment may be applied to a bottom emission type of organic EL display device in which the anode is the counter electrode. In such a case, the low refractive index layer is provided on the interlayer insulating layer, and a pixel electrode that is a cathode is provided on the low refractive index layer. Further, the interlayer insulating layer may be formed of a low refractive index material, and the interlayer insulating layer may function as the low refractive index layer. Further, for example, in a top emission type of organic EL display device in which the anode is the counter electrode and in a bottom emission type of organic EL display device in which the cathode is the counter electrode, at least one embodiment of the present disclosure is applicable when designing the optical film thickness L1 in FIG. 2 in order to utilize first order optical interference.

Further, at least one embodiment includes the intermediate layer 18, the hole injection layer 15, and the hole transport layer 16, but the present invention is not limited to this. For example, according to at least one embodiment, the organic EL element does not include the intermediate layer 18, and according to at least one embodiment, the organic EL element does not include the hole transport layer 16. Further, for example, a single layer hole injection/transport layer may be provided according to at least one embodiment instead of the hole injection layer 15 and the hole transport layer 16.

Further, without being limited to a display device, at least one embodiment may be applied to a panel type of illumination device such as an organic EL illumination device.

Although the organic light emitting panel and display device pertaining to the present disclosure are described based on at least one embodiment, the present invention is not limited to the at least one embodiment described. Embodiments obtained by applying various modifications conceived of by a person skilled in the art to the at least one embodiment described above, and embodiments realized by any combination of elements and functions of the at least one embodiment and modifications thereof that does not depart from the spirit of the present invention are also included in the present invention.

What is claimed is:

1. An organic electroluminescence (EL) element comprising:
    an anode;
    a light emitting layer disposed above the anode;
    a functional layer disposed on and in contact with the light emitting layer, the functional layer including a first metal;
    a cathode disposed on and in contact with the functional layer, the cathode made of a light transmissive metal oxide; and
    a low refractive index layer disposed on and in contact with the cathode, wherein
    refractive index of the low refractive index layer is smaller than refractive index of the cathode,
    film thickness of the functional layer is from 15 nm to 35 nm, and
    a distance between an anode-side surface of the light emitting layer and an interface between the cathode and the low refractive index layer is 110 nm or greater.

2. An organic electroluminescence (EL) element comprising:
    an anode;
    a light emitting layer disposed above the anode;
    a functional layer disposed above the light emitting layer, the functional layer including a first metal;
    an intermediate layer disposed between and in contact with both the light emitting layer and the functional layer, the intermediate layer including a fluoride of a second metal that is an alkali metal or alkaline earth metal;
    a cathode disposed on and in contact with the functional layer, the cathode made of a light transmissive metal oxide; and
    a low refractive index layer disposed on and in contact with the cathode, wherein
    refractive index of the low refractive index layer is smaller than refractive index of the cathode,
    film thickness of the functional layer is from 15 nm to 35 nm, and
    a distance between an anode-side surface of the light emitting layer and an interface between the cathode and the low refractive index layer is 110 nm or greater.

3. The organic EL element of claim 2, wherein the second metal is sodium.

4. The organic EL element of claim 1, wherein
    the cathode is made of indium tin oxide (ITO) or indium zinc oxide (IZO), and
    the refractive index of the low refractive index layer is 1.7 or less.

5. The organic EL element of claim 1, wherein
    the low refractive index layer is made of an insulative inorganic material.

6. The organic EL element of claim 5, wherein material of the low refractive index layer is selected from one or more of SiO, SiON, NaF, $MgF_2$, and LiF.

7. The organic EL element of claim 1, wherein
    an optical resonator structure is formed in a region between a light emitting layer-side surface of the anode and an interface between the cathode and the low refractive index layer, the surface and the interface functioning as reflective surfaces.

8. The organic EL element of claim 1, wherein
    the functional layer is made of an organic material with an electron transport property, doped with the first metal.

9. The organic EL element of claim 1, wherein
    The first metal material is selected from an alkali metal or alkaline earth metal.

10. The organic EL element of claim 9, wherein
    the first metal is barium or lithium.

11. The organic EL element of claim 1, wherein
    concentration of the first metal in the functional layer is from 5 wt % to 40 wt %.

12. An organic electroluminescence (EL) display panel in which an organic EL element is provided in plurality on a surface of a substrate, the organic EL element comprising:
    an anode;
    a light emitting layer disposed above the anode;
    a functional layer disposed on and in contact with the light emitting layer, the functional layer including a first metal;
    a cathode disposed on and in contact with the functional layer, the cathode made of a light transmissive metal oxide; and
    a low refractive index layer disposed on and in contact with the cathode, wherein refractive index of the low refractive index layer is smaller than refractive index of the cathode, film thickness of the functional layer is from 15 nm to 35 nm, and a distance between an anode-side surface of the light emitting layer and an interface between the cathode and the low refractive index layer is 110 nm or greater.

13. A method of manufacturing an organic electroluminescence (EL) element, the method comprising:

forming an anode;

forming a light emitting layer above the anode;

forming a functional layer including a metal material so as to be on and in contact with the light emitting layer;

forming a cathode made of a light transmissive metal oxide so as to be on and in contact with the functional layer; and forming a low refractive index layer that has a refractive index lower than that of the cathode so as to be on and in contact with the cathode, wherein when forming the functional layer, film thickness of the functional layer is made to be from 15 nm to 35 nm, and when forming the cathode, a distance between an anode-side surface of the light emitting layer and an interface between the cathode and the low refractive index layer is made to be 110 nm or greater.

14. A method of manufacturing an organic electroluminescence (EL) element, the method comprising:

forming an anode;

forming a light emitting layer above the anode;

forming an intermediate layer so as to be on and in contact with the light emitting layer;

forming a functional layer including a metal material so as to be on and in contact with the intermediate layer;

forming a cathode made of a light transmissive metal oxide so as to be on and in contact with the functional layer; and forming a low refractive index layer that has a refractive index lower than that of the cathode so as to be on and in contact with the cathode, wherein when forming the intermediate layer, the intermediate layer is made to include a fluoride of a second metal that is an alkali metal or alkaline earth metal, when forming the functional layer, film thickness of the functional layer is made to be from 15 nm to 35 nm, and when forming the cathode, a distance between an anode-side surface of the light emitting layer and an interface between the cathode and the low refractive index layer is made to be 110 nm or greater.

15. The method of claim 13, wherein the cathode is made of indium tin oxide (ITO) or indium zinc oxide (IZO), and the low refractive index layer is made of insulative inorganic material that has a refractive index of 1.7 or less.

16. The method of claim 15, wherein the insulative inorganic material is one or more materials selected from SiO, SiON, NaF, $MgF_2$, and LiF.

17. The method of claim 13, wherein an optical resonator structure is formed in a region surrounded by a light emitting layer-side surface of the anode and an interface between the cathode and the low refractive index layer, the surface and the interface functioning as reflective surfaces.

18. The method of claim 13, wherein when forming the functional layer, the functional layer is made of an organic material that has an electron transport property and is doped with the metal material.

19. The method of claim 18, wherein when forming the functional layer, concentration of the metal material dopant in the organic material is from 5 wt % to 40 wt %.

* * * * *